US011916491B2

(12) United States Patent
Miyamoto et al.

(10) Patent No.: US 11,916,491 B2
(45) Date of Patent: Feb. 27, 2024

(54) ELECTRIC POWER CONVERTER

(71) Applicant: DENSO CORPORATION, Kariya (JP)

(72) Inventors: Shingo Miyamoto, Toyota (JP); Yohei Imai, Toyota (JP)

(73) Assignee: DENSO CORPORATION, Kariya (JP)

( * ) Notice: Subject to any disclaimer, the term of this patent is extended or adjusted under 35 U.S.C. 154(b) by 177 days.

(21) Appl. No.: 17/683,450

(22) Filed: Mar. 1, 2022

(65) Prior Publication Data

US 2022/0190737 A1 Jun. 16, 2022

Related U.S. Application Data

(63) Continuation of application No. PCT/JP2019/034447, filed on Sep. 2, 2019.

(51) Int. Cl.
*H02M 7/53* (2006.01)
*H02M 7/00* (2006.01)
*H02M 7/5387* (2007.01)

(52) U.S. Cl.
CPC ....... *H02M 7/003* (2013.01); *H02M 7/53871* (2013.01)

(58) Field of Classification Search
CPC .................. H02M 7/003; H02M 7/53871
See application file for complete search history.

(56) References Cited

U.S. PATENT DOCUMENTS

| 8,665,623 B2* | 3/2014 | Suzuki | H02M 7/003 363/141 |
| 2012/0300521 A1* | 11/2012 | Hida | H05K 7/14329 363/131 |
| 2013/0003301 A1* | 1/2013 | Miyamoto | H05K 7/20927 361/699 |
| 2013/0264891 A1* | 10/2013 | Sawada | H05K 7/14329 307/147 |
| 2013/0272046 A1* | 10/2013 | Matsuoka | H01L 24/33 363/132 |

FOREIGN PATENT DOCUMENTS

| JP | 2011-151992 A | 8/2011 |
| JP | 2017-099140 A | 6/2017 |

* cited by examiner

*Primary Examiner* — Rina I Duda
(74) *Attorney, Agent, or Firm* — Oliff PLC

(57) ABSTRACT

An electric power converter includes a plurality of power modules, a capacitor, a positive bus bar, and a negative bus bar. Each of the power modules includes a positive terminal and a negative terminal on a side facing the capacitor. Leading ends of the positive terminal and negative terminal are parallel to the side. The positive bus bar includes a positive/negative base plate joined to a positive/negative electrode of the capacitor and a positive/negative flange bent from the positive/negative base plate. The positive/negative flange is joined to the positive/negative terminals of the power modules. The positive flange and the negative flange extend in directions away from the capacitor.

5 Claims, 5 Drawing Sheets

ELECTRIC POWER CONVERTER

CROSS-REFERENCE TO RELATED APPLICATION

This application is the U.S. bypass application of International Application No. PCT/JP2019/034447 filed on Sep. 2, 2019 which designated the U.S., the content of which is incorporated herein by reference.

TECHNICAL FIELD

The present disclosure relates to an electric power converter that includes a plurality of power modules containing switching elements and a capacitor for electric power conversion.

BACKGROUND

Electric power converters that include a plurality of power modules containing switching elements for electric power conversion are known. For example, JP 2011-151992 A and JP 2017-99140 A disclose such electric power converters.

SUMMARY

An electric power converter according to one aspect of the present disclosure includes a plurality of power modules, a capacitor, a positive bus bar, and a negative bus bar. The power modules each contain switching elements for electric power conversion. The plurality of power modules is stacked along a first direction (X direction). The capacitor is arranged adjacent to the plurality of power modules in a second direction (Y direction) perpendicular to the first direction (X direction).

Each of the power modules has a positive terminal and a negative terminal on the side facing the capacitor. The positive terminal is connected to the positive pole of the switching element within the power module, and the negative terminal is connected to the negative pole of the switching element. The positive terminal and the negative terminal are aligned in a third direction (Z direction) perpendicular to both the first direction (X direction) and the second direction (Y direction). The leading end of the positive terminal and the leading end of the negative terminal are parallel to the side of the power module (the side on which the positive terminal and the negative terminal are provided).

The capacitor includes a positive electrode on one end surface and a negative electrode on the other end surface in the third direction (Z direction).

The positive bus bar includes a positive base plate joined to the positive electrode and a positive flange bent from the positive base plate to the third direction (Z direction). The positive flange is joined to the positive terminals of the plurality of power modules. The negative bus bar includes a negative base plate joined to the negative electrode and a negative flange bent from the negative base plate to the third direction (Z direction). The negative flange is joined to the negative terminals of the plurality of power modules. The positive flange and the negative flange extend in directions away from the capacitor along the third direction (Z direction).

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
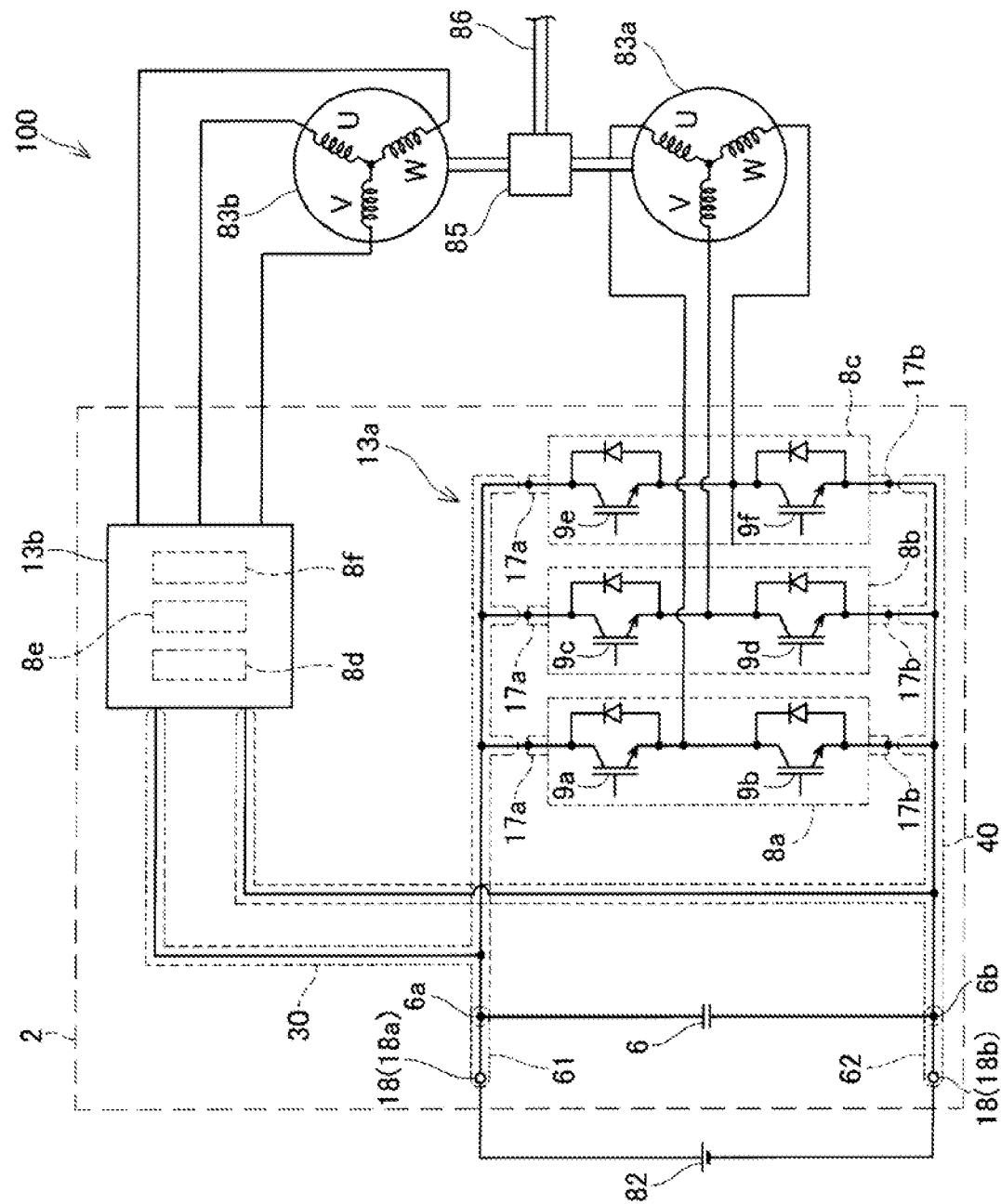
FIG. 1 shows a circuit diagram of an electric automobile including an electric power converter in a first embodiment.

The electric power converter disclosed in JP 2017-99140 A also includes a capacitor connected to the plurality of power modules. The plurality of power modules is stacked along a first direction (X direction). Each of the power modules includes a positive terminal and a negative terminal on the side oriented in a second direction (Y direction) perpendicular to the first direction. The capacitor is arranged adjacent to the plurality of power modules in a third direction (Z direction) perpendicular to both the first direction and the second direction. The positive electrode of the capacitor and the positive terminals of the plurality of power modules are connected via a positive bus bar, and the negative electrode of the capacitor and the negative terminals of the plurality of power modules are connected via a negative bus bar.

The terminals (positive terminals or negative terminals) of the plurality of power modules are aligned in the stacking direction of the power modules. If the terminals of the power modules and the capacitor are close to each other, it is difficult to join the bus bar and the terminals. Therefore, in the electric power converter disclosed in JP 2017-99140 A, the terminals of the power modules are provided on the side oriented in the second direction, the power modules and the capacitor are aligned in the third direction, and the terminals are separated from the capacitor. Provided herein is a technique for achieving both bringing the terminals of the plurality of power modules and the capacitor close to each other and easily joining the terminals and the bus bars.

An electric power converter according to one aspect of the present disclosure includes a plurality of power modules, a capacitor, a positive bus bar, and a negative bus bar. The power modules each contain switching elements for electric power conversion. The plurality of power modules is stacked along a first direction (X direction). The capacitor is arranged adjacent to the plurality of power modules in a second direction (Y direction) perpendicular to the first direction (X direction).

Each of the power modules has a positive terminal and a negative terminal on the side facing the capacitor. The positive terminal is connected to the positive pole of the switching element within the power module, and the negative terminal is connected to the negative pole of the switching element. The positive terminal and the negative terminal are aligned in a third direction (Z direction) perpendicular to both the first direction (X direction) and the second direction (Y direction). The leading end of the positive terminal and the leading end of the negative terminal are parallel to the side of the power module (the side on which the positive terminal and the negative terminal are provided).

The capacitor includes a positive electrode on one end surface and a negative electrode on the other end surface in the third direction (Z direction).

The positive bus bar includes a positive base plate joined to the positive electrode and a positive flange bent from the positive base plate to the third direction (Z direction). The positive flange is joined to the positive terminals of the plurality of power modules. The negative bus bar includes a negative base plate joined to the negative electrode and a negative flange bent from the negative base plate to the third direction (Z direction). The negative flange is joined to the negative terminals of the plurality of power modules. The positive flange and the negative flange extend in directions away from the capacitor along the third direction (Z direction).

According to the above-described structure, the capacitor is adjacent to the sides on which the positive terminals and the negative terminals are provided. The capacitor is located close to the positive terminals and the negative terminals.

On the other hand, the junctions between the positive flange and the positive terminals are located adjacent to the capacitor in the third direction, and the junctions between the negative flange and the negative terminals are located adjacent to the capacitor on the opposite side. The junctions of the positive terminals and the junctions of the negative terminals are distributed to both sides of the capacitor, thereby facilitating the joining work. The electric power converter disclosed herein enables both bringing the terminals of the plurality of power modules and the capacitor close to each other and easily joining the terminals and the bus bars.

The details of the technique disclosed herein and its further improvements will be described below.

First Embodiment

An electric power converter in a first embodiment will be described with reference to the drawings. The electric power converter in the first embodiment is a device mounted in an electric automobile. The electric power converter converts the electric power from the battery into electric power for driving the motor for traveling. FIG. 1 shows a block diagram of an electric power system in an electric automobile 100 including an electric power converter 2.

The electric automobile 100 includes a battery 82, an electric power converter 2, and two motors 83*a* and 83*b* for traveling. The motors 83*a* and 83*b* have output shafts coupled to a gear set 85. The gear set 85 is also coupled to an axle 86. The gear set 85 combines output torques of the motors 83*a* and 83*b* and transmits the combined torque to the axle 86.

The electric power converter 2 converts the output electric power (direct-current power) of the battery 82 into driving power (alternating-current power) of the motors 83*a* and 83*b*. The positive pole of the battery 82 is connected to an input positive end 18*a* of the electric power converter 2, and the negative pole of the battery 82 is connected to an input negative end 18*b* of the electric power converter 2.

A capacitor 6 is connected to the input terminals 18. The capacitor 6 is included for suppressing ripples of input current (input voltage). The input positive end 18*a* of the electric power converter 2 is connected to a positive electrode 6*a* of the capacitor 6 via an electric power supply positive bus bar 61, and the input negative end 18*b* of the electric power converter 2 is connected to a negative electrode 6*b* of the capacitor 6 via an electric power supply negative bus bar 62. The bus bars are conductive members with small internal resistance and are typically made of metal rods.

The electric power converter 2 includes two inverter circuits 13*a* and 13*b*. Respective direct-current ends of the inverter circuits 13*a* and 13*b* are connected in parallel to the capacitor 6. An alternating-current end of the inverter circuit 13*a* is connected to the motor 83*a*, and an alternating-current end of the inverter circuit 13*b* is connected to the motor 83*b*.

The inverter circuit 13*a* is configured such that three sets of a series circuit formed of two switching elements are connected in parallel. The switching elements 9*a* and 9*b*, the switching element 9*c* and 9*d*, and the switching elements 9*e* and 9*f* constitute their respective series circuits. Diodes are connected in reverse parallel to the switching elements.

When the switching elements 9*a* and 9*b* in the series circuit are alternately turned on and off, alternating current is output from a midpoint in the series circuit. The alternating current is output from each of the three series circuits. The circuit in the range of a dotted-line rectangle indicated with reference sign 8*a* corresponds to a power module 8*a* described later. Reference signs 17*a* and 17*b* indicate terminals extended from the power module 8*a*. Reference sign 17*a* indicates the terminal (positive terminal 17*a*) electrically continuous with the high-potential side of the series circuit of the switching elements 9*a* and 9*b*. Reference sign 17*b* indicates the terminal (negative terminal 17*b*) electrically continuous with the low-potential side of the series circuit of the switching elements 9*a* and 9*b*. As described next, the terms positive terminal 17*a* and negative terminal 17*b* will also be used in the other power modules.

Although not shown in FIG. 1, the power module 8*a* also includes a midpoint terminal 17*c*. The midpoint terminal 17*c* is electrically continuous with the midpoint in the series circuit of the switching elements 9*a* and 9*b*. The positive terminal 17*a*, the negative terminal 17*b*, and the midpoint terminal 17*c* will be described later with reference to FIG. 3. Hereinafter, the positive terminal 17*a*, the negative terminal 17*b*, and the midpoint terminal 17*c* will also be collectively called terminals 17.

The series circuit of the switching elements 9*c* and 9*d* (and diodes connected in reverse parallel to the switching elements) constitute a power module 8*b*. The series circuit of the switching elements 9*e* and 9*f* (and diodes connected in reverse parallel to the switching elements) constitute a power module 8*c*. The power modules 8*b* and 8*c* are configured in the same manner as the power module 8*a*. As with the power module 8*a*, each of the power modules 8*b* and 8*c* includes a positive terminal 17*a*, a negative terminal 17*b*, and a midpoint terminal 17*c* electrically continuous with the respective high-potential side, low-potential side, and midpoint of the series circuit of the two switching elements (the midpoint terminals 17*c* are not shown).

The switching elements 9*a* to 9*f* are transistors and typically insulated gate bipolar transistors (IGBTs), but may be other transistors, for example, metal oxide semiconductor field effect transistors (MOSFETs). In addition, the switching elements here are used for electric power conversion and may also be called power semiconductor elements.

The inverter circuit 13*b* is structured in the same manner as the inverter circuit 13*a*, and includes three power modules 8*d* to 8*f*. Since the power modules 8*d* to 8*f* are structured in the same manner as the power module 8*a*, FIG. 1 schematically depicts the power modules 8*d* to 8*f* and their connection relationship.

Referring to FIG. 1, dotted lines with reference signs 8*a* to 8*f* correspond to power modules. The electric power converter 2 includes six sets of a series circuit of the two switching elements. As hardware, the two switching elements constituting the series circuit and diodes connected in reverse parallel to the switching elements are housed in one package (power module package). Hereinafter, if it is not necessary to differentiate one from the others of the power modules 8a to 8f, any one of them will be referred to power module 8.

The high potential-side terminals (positive terminals 17a) of the four power modules (four sets of series circuit) are connected to the positive electrode 6a of the capacitor 6, and the low potential-side terminals (negative terminals 17b) of the same are connected to the negative electrode 6b of the capacitor 6. Referring to FIG. 1, an electric conductive pathway in dotted lines with reference sign 30 corresponds to the bus bar (positive bus bar 30) connecting the positive terminals 17a of the plurality of power modules 8 and the positive electrode 6a of the capacitor 6. An electric conductive pathway in dotted lines with reference sign 40 corresponds to the bus bar (negative bus bar 40) connecting the plurality of negative terminals 17b and the negative electrode 6b of the capacitor 6. Next, the structures of the plurality of power modules 8, positive bus bar 30, and negative bus bar 40 will be described.

Figure 2:
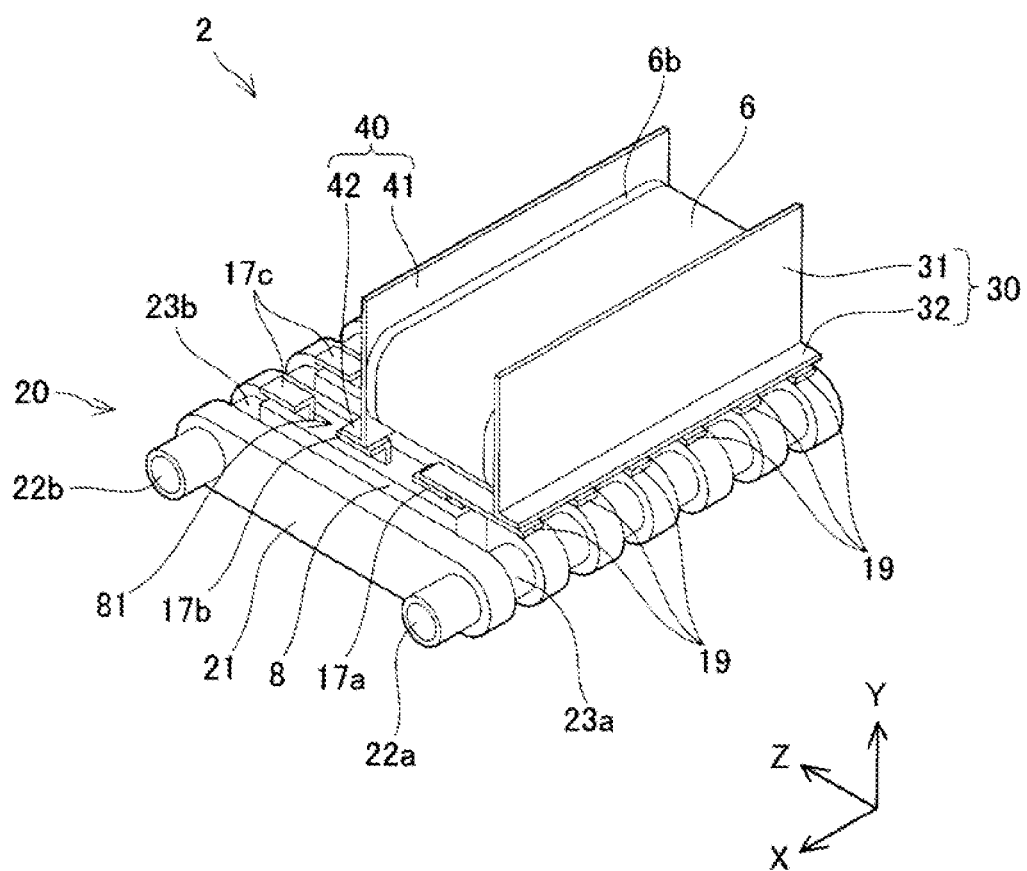
FIG. 2 shows a perspective view of the electric power converter.
Figure 3:
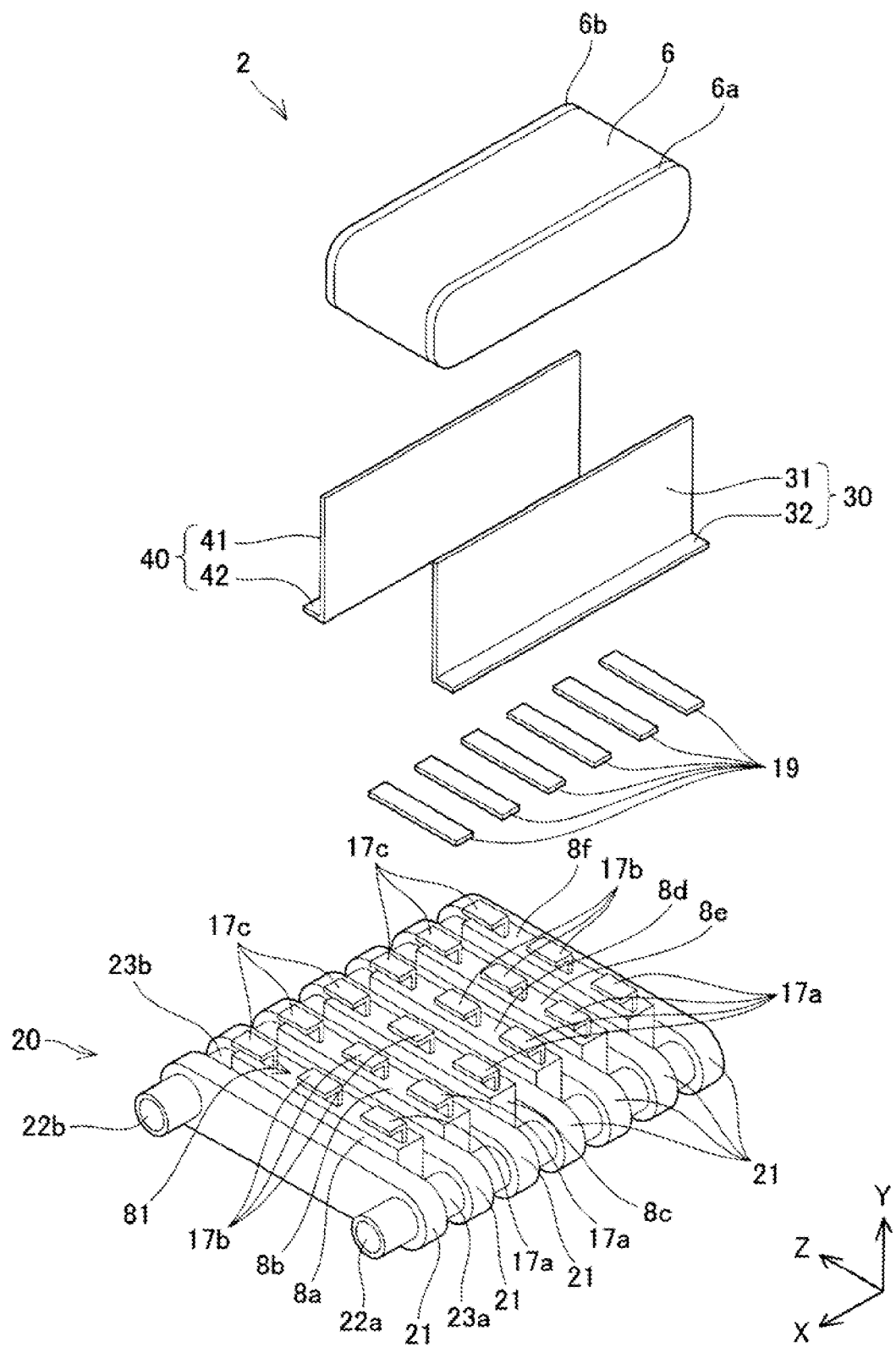
FIG. 3 shows an exploded view of the electric power converter.

FIG. 2 shows a perspective view of hardware of the electric power converter 2. FIG. 2 is a perspective view of an assembly of a stacked unit 20 and the capacitor 6 connected via the positive bus bar 30 and the negative bus bar 40, where the other components of the electric power converter 2 are not shown. The stacked unit 20 is a device in which the power modules 8 (8a to 8f) described above and a plurality of coolers 21 are stacked. FIG. 3 shows an exploded view of the electric power converter 2. FIG. 3 is an exploded view of the assembly described above, where the other components of the electric power converter 2 are not shown as well. The X direction in the coordinate system in the drawings corresponds to the stacking direction of the power modules 8 (8a to 8f). In the subsequent drawings as well, the X direction corresponds to the stacking direction.

The hardware of the electric power converter 2, especially the above-mentioned assembly, will be described with reference to FIGS. 2 and 3. The plurality of power modules 8 (8a to 8f) constitutes the stacked unit 20 together with the plurality of coolers 21. Since the power modules 8a to 8f are of the same shape, only the power module at the left end is representatively shown with reference number 8 and the other power modules are shown without reference number in FIG. 2. In addition, only the cooler at the left end is representatively shown with reference number 21 and the remaining coolers are shown without reference number in FIG. 2.

The plurality of power modules 8 and the plurality of coolers 21 are alternately stacked one by one. The power modules 8 have a flat shape and their wide surfaces are in contact with the coolers 21.

The cooler 21 at the left end in the drawings is provided with a refrigerant supply port 22a and a refrigerant discharge port 22b. The adjacent coolers 21 are connected via two coupling pipes 23a and 23b. In FIGS. 2 and 3, only the coupling pipes 23a and 23b at the left end are shown with reference signs and the remaining coupling pipes are shown without reference signs. Each of the coolers 21 has a cavity (refrigerant flow path) therein and the coupling pipes 23a and 23b cause the refrigerant flow paths of the adjacent coolers 21 to communicate with each other.

One coupling pipe 23a is positioned to overlap the refrigerant supply port 22a as seen from the stacking direction. The other coupling pipe 23b is positioned to overlap the refrigerant discharge port 22b as seen from the stacking direction. The electric power converter 22a and the refrigerant discharge port 22b are connected to a refrigerant circulation device not shown. The refrigerant supplied from the electric power converter 22a is distributed to all the coolers 21 through the one coupling pipe 23a. The refrigerant absorbs heat from the adjacent power modules 8 while passing through the coolers 21. The refrigerant having absorbed heat is discharged from the stacked unit 20 through the other coupling pipe 23b and the refrigerant discharge port 22b. The power modules 8 are cooled from their both sides and thus the stacked unit 20 has high cooling performance for the power modules 8.

The main body of each power modules 8 is a package containing the switching elements and diodes. The package is made of a resin. The positive terminal 17a, the negative terminal 17b, and the midpoint terminal 17c extend from a side 81 as one narrow surface of the package of each power module 8. In FIGS. 2 and 3, only the side of the power module 8 at the left end is shown with reference number 81 and the same sides of the remaining power modules 8 are shown without reference number. In FIGS. 2 and 3, the bus bar connected to the midpoint terminals 17c is not shown.

The capacitor 6 is arranged adjacent to the plurality of power modules 8 in the Y direction orthogonal to the stacking direction of the plurality of power modules 8 (the X direction in the drawings). In other words, the capacitor 6 is arranged to face the sides 81 of the plurality of power modules 8. The three terminals 17 (the positive terminal 17a, the negative terminal 17b, and the midpoint terminal 17c) extend from the side 81 of each power module 8 facing the capacitor 6. The three terminals 17 align along the Z direction in the coordinate system of the drawings. Each of the three terminals 17 is made of a wide plate and its wide surface of a leading end is in parallel to the side 81.

The capacitor 6 has the positive electrode 6a at the end surface oriented in the +Y direction and the negative electrode 6b at the end surface oriented in the opposite direction (−Y direction). The capacitor 6 is arranged in a posture in which the positive electrode 6a and the negative electrode 6b are oriented in the Y direction.

The positive bus bar 30 has a positive base plate 31 facing the positive electrode 6a of the capacitor 6 and a positive flange 32 bent in an L shape from the positive base plate 31 in the −Z direction. The positive base plate 31 is joined to the positive electrode 6a of the capacitor 6. The positive flange 32 is parallel to the flat surfaces of the leading ends of the positive terminals 17a in the plurality of power modules 8. First ends of extension plates 19 are joined to the corresponding positive terminals 17a. Second ends of the extension plates 19 are joined to the positive flange 32 of the positive bus bar 30. In other words, the positive terminals 17a of the plurality of power modules 8 are joined to the positive flange 32 of the positive bus bar 30 via the corresponding extension plates 19.

The negative bus bar 40 has a negative base plate 41 facing the negative electrode 6b of the capacitor 6 and a negative flange 42 bent in an L shape from the negative base plate 41 in the +Z direction. The negative base plate 41 is joined to the negative electrode 6b of the capacitor 6. The negative flange 42 faces the leading ends of the negative terminals 17b in the plurality of power modules 8 and is joined to the negative terminals 17b.

The positive flange 32 of the positive bus bar 30 and the negative flange 42 of the negative bus bar 40 extend in directions away from the capacitor 6. In other words, the positive flange 32 and the negative flange 42 extend in directions away from each other.

Figure 4:
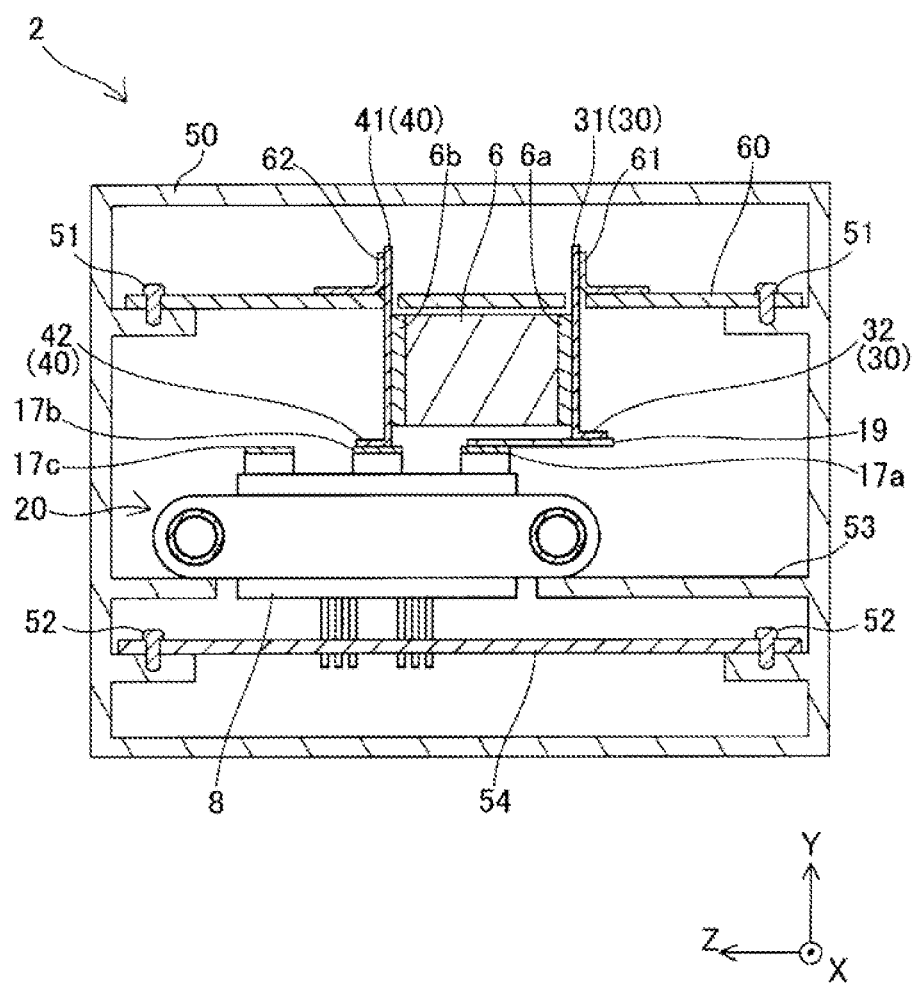
FIG. 4 shows a cross-sectional view of the electric power converter.

FIG. 4 shows a cross-sectional view of the electric power converter 2. FIG. 4 is a cross-sectional view of the electric power converter 2 taken along a plane orthogonal to the stacking direction (X direction) of the plurality of power modules 8. FIG. 4 also shows a housing 50 containing components such as the stacked unit 20. FIG. 4 does not show the bus bar connected to the midpoint terminals 17c of the power modules 8 and other several components.

The stacked unit 20 is fixed to a partition plate 53 of the housing 50. A substrate 54 is arranged under the stacked unit 20. The substrate 54 is fixed to the housing via bolts 52. A plurality of control terminals extends from the lower surfaces of the power modules 8 and connected to the substrate 54. Control circuits of the switching elements contained in the power modules 8 are mounted on the substrate 54.

As described above, the negative flange 42 of the negative bus bar 40 is joined to the negative terminals 17b of the power modules 8, and the first ends of the extension plates 19 are joined to the positive terminals 17a of the power modules 8. The extension plates 19 extend in the Z direction, and their second ends are joined to the positive flange 32 of the positive bus bar 30. The positive base plate 31 of the positive bus bar 30 is connected to the positive electrode 6a of the capacitor 6, and the negative base plate 41 of the negative bus bar 40 is joined to the negative electrode 6b of the capacitor 6. In other words, the positive terminals 17a are connected to the positive electrode 6a of the capacitor 6 via the extension plates 19 and the positive bus bar 30, and the negative terminals 17b are connected to the negative electrode 6b of the capacitor 6 via the negative bus bar 40.

The positive bus bar 30 and the negative bus bar 40 extend more upward than the capacitor 6. A bus module 60 is arranged adjacent to the capacitor 6 in the Y direction. The bus bar module 60 is arranged on the side of the capacitor 6 opposite to the power modules 8. The bus bar module 60 is a plate. The bus bar module 60 is fixed to the housing 50 via bolts 51.

The bus bar module 60 has an electric power supply positive bus bar 61 and an electric power supply negative bus bar 62 attached thereto. The leading end of the positive bus bar 30 is joined to the electric power supply positive bus bar 61, and the leading end of the negative bus bar 40 is joined to the electric power supply negative bus bar 62. As described above, the electric power supply positive bus bar 61 and the electric power supply negative bus bar 62 are bus bars that connect the input ends 18 (see FIG. 1) and capacitor 6 of the electric power converter 2. As clearly shown in FIG. 4, the capacitor 6 is joined to the positive bus bar 30 and the negative bus bar 40 and is supported by the positive bus bar 30 and the negative bus bar 40. First ends (upper ends) of the positive bus bar 30 and the negative bus bar 40 are supported in the housing 50 via the bus bar module 60. Second ends (lower ends) of the positive bus bar 30 and the negative bus bar 40 are supported in the housing 50 via the plurality of power modules 8 in the stacked unit 20. The capacitor 6 itself is not in direct contact with the housing 50 and is supported indirectly in the housing 50 via the bus bars 30 and 40 and others. Although not in direct contact with the housing 50, the capacitor 6 has vibration resistance characteristics because it is supported at both sides by the positive bus bar 30 and the negative bus bar 40.

The advantages of the above-described structures will be described. The capacitor 6 is arranged to face the positive terminals 17a and the negative terminals 17b. Therefore, the capacitor 6 is close to the positive terminals 17a and the negative terminals 17b so that the positive terminals 17a and the negative terminals 17b can be shortened. In addition, the positive flange 32 of the positive bus bar 30 extends away from the capacitor 6, and the negative flange 42 of the negative bus bar 40 extends away from the capacitor 6 on the opposite side. This facilitates the joining between the positive flange 32 and the positive terminals 17a and the joining between the negative flange 42 and the negative terminals 17b. The positive flange 32 and the positive terminals 17a are joined together via the extension plates 19.

Alternatively, the positive terminals 17a and the positive flange 32 may be joined together without the extension plates 19 and the negative terminals 17b and the negative flange 42 may be joined together via the extension plates 19.

As shown in FIGS. 2 and 3, the plurality of power modules 8 and the capacitor 6 overlap each other in the Y direction.

The plurality of power modules 8 and the capacitor 6 are contained in the housing 50. The plurality of power modules 8 is fixed to the housing 50. The plate-shaped bus bar module 60 is also fixed to the housing 50. The bus bar module 60 is adjacent to the capacitor 6 on the side opposite to the plurality of power modules 8. The upper ends of the positive bus bar 30 and negative bus bar 40 are fixed to the bus bar module 60. The lower ends of the positive bus bar 30 and negative bus bar 40 are fixed to the plurality of power modules 8. The capacitor 6 is supported in the housing 50 via the positive bus bar 30, the negative bus bar 40, the power modules 8, and the bus bar module 60. The bus bar module 60 supports the capacitor 6 and thus can be called support plate.

The electric power supply positive bus bar 61 and the electric power supply negative bus bar 62 are attached to the bus bar module 60 to supply electric power from the power source to the capacitor 6. The positive bus bar 30 is joined to the electric power supply positive bus bar 61, and the negative bus bar 40 is joined to the electric power supply negative bus bar 62.

Second Embodiment

Figure 5:
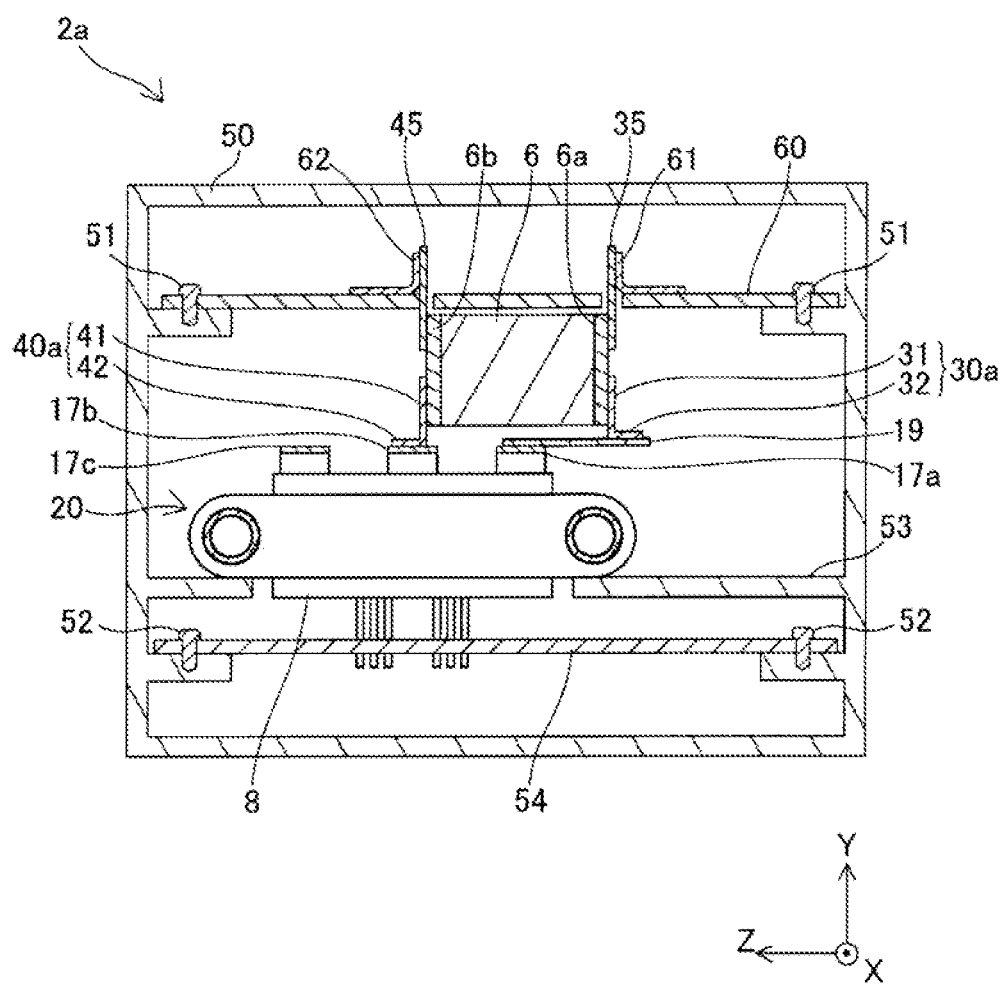
FIG. 5 shows a cross-sectional view of an electric power converter in a second embodiment.

FIG. 5 is a cross-sectional view of an electric power converter 2a in a second embodiment. In the electric power converter 2a of the second embodiment, a positive base plate 31 of a positive bus bar 30a and a negative base plate 41 of a negative bus bar 40a are short. The positive base plate 31 covers the lower part of a positive electrode 6a of a capacitor 6, and the negative base plate 41 covers the lower part of a negative electrode 6b of the capacitor 6. Another positive bus bar 35 is joined to the upper part of the positive electrode 6a of the capacitor 6, and another negative bus bar 45 is connected to the upper part of the negative electrode 6b of the capacitor 6. The upper part of the other positive bus bar 35 is joined to an electric power supply positive bus bar 61 of a bus bar module 60, and the upper part of the other negative bus bar 45 is joined to an electric power supply negative bus bar 62 of the bus bar module 60.

Points to note on the technique described in relation to the embodiments will be described. The bus bar module 60 corresponds to one embodiment of a support plate. The X direction, Y direction, and Z direction in the coordinate system in the drawings correspond to a first direction, a second direction, and a third direction, respectively.

Specific embodiments of the present invention have been described above in detail but they are merely exemplifications and are not intended to limit the claims. The technique described in the claims also includes various modifications and alterations of the specific embodiments exemplified above. The technical elements described in this specification and the drawings have technical utility singly or in various combinations thereof, and are not limited to the combinations described in the claims as of the application. In addition, the technique exemplified in this specification and the drawings can attain a plurality of objectives at the same time, and attaining one of the objectives has technical utility by its own.

What is claimed is:

1. An electric power converter comprising:
   a plurality of power modules that contains switching elements for electric power conversion and is stacked along a first direction;
   a capacitor that is arranged adjacent to the plurality of power modules in a second direction perpendicular to the first direction; and
   a positive bus bar and a negative bus bar that connect the plurality of power modules and the capacitor, wherein
   each of the power modules has a positive terminal and a negative terminal provided on a side facing the capacitor, the positive terminal and the negative terminal being aligned in a third direction perpendicular to both the first direction and the second direction,
   a leading end of the positive terminal and a leading end of the negative terminal are parallel to the side,
   the capacitor includes a positive electrode on one end surface and a negative electrode on the other end surface in the third direction,
   the positive bus bar includes a positive base plate that is joined to the positive electrode and a positive flange that is bent from the positive base plate in the third direction and is joined to the positive terminals of the plurality of power modules,
   the negative bus bar includes a negative base plate that is joined to the negative electrode and a negative flange that is bent from the negative base plate in the third direction and is joined to the negative terminals of the plurality of power modules, and
   the positive flange and the negative flange extend in directions away from the capacitor along the third direction.

2. The electric power converter according to claim 1, wherein
   the plurality of power modules and the capacitor overlap along the second direction.

3. The electric power converter according to claim 1, further comprising:
   a housing that contains the plurality of power modules and the capacitor; and
   a support plate that is supported in the housing and is arranged adjacent to the capacitor on the side opposite to the power modules in the second direction, wherein
   another positive bus bar connected to the positive bus bar or the positive electrode is fixed to the support plate,
   another negative bus bar connected to the negative bus bar or the negative electrode is fixed to the support plate, and
   the capacitor is supported in the housing via the support plate, the power modules, the positive bus bar, and the negative bus bar.

4. The electric power converter according to claim 3, wherein
   an electric power supply positive bus bar and an electric power supply negative bus bar are attached to the support plate to supply electric power from a power source to the capacitor, the positive bus bar being joined to the electric power supply positive bus bar and the negative bus bar being joined to the electric power supply negative bus bar.

5. The electric power converter according to claim 1, wherein
   the positive terminals and the positive flange are joined together via extension plates extending in the third direction, or the negative terminals and the negative flange are joined together via extension plates extending in the third direction.

* * * * *